United States Patent
Tanaka et al.

(10) Patent No.: US 9,523,153 B2
(45) Date of Patent: Dec. 20, 2016

(54) PRE-TREATMENT METHOD FOR PLATING AND STORAGE MEDIUM

(71) Applicant: Tokyo Electron Limited, Tokyo (JP)

(72) Inventors: Takashi Tanaka, Nirasaki (JP); Yuichiro Inatomi, Nirasaki (JP); Kazutoshi Iwai, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 226 days.

(21) Appl. No.: 14/548,893

(22) Filed: Nov. 20, 2014

(65) Prior Publication Data

US 2015/0140209 A1    May 21, 2015

(30) Foreign Application Priority Data

Nov. 21, 2013    (JP) .................. 2013-241090

(51) Int. Cl.

| | | |
|---|---|---|
| C23C 28/00 | (2006.01) | |
| C23C 28/02 | (2006.01) | |
| C23C 18/04 | (2006.01) | |
| C23C 18/06 | (2006.01) | |
| C23C 18/16 | (2006.01) | |
| C23C 18/32 | (2006.01) | |
| H01L 21/768 | (2006.01) | |
| H01L 21/288 | (2006.01) | |
| C23C 18/18 | (2006.01) | |
| C23C 18/02 | (2006.01) | |

(Continued)

(52) U.S. Cl.
CPC .............. *C23C 28/34* (2013.01); *C23C 18/04* (2013.01); *C23C 18/06* (2013.01); *C23C 18/165* (2013.01); *C23C 18/1893* (2013.01); *C23C 18/32* (2013.01); *C23C 28/00* (2013.01); *C23C 28/021* (2013.01); *C23C 28/321* (2013.01); *H01L 21/288* (2013.01); *H01L 21/76874* (2013.01); *H01L 21/76898* (2013.01); *C23C 18/02* (2013.01); *C23C 18/1275* (2013.01); *C23C 18/1651* (2013.01); *C23C 18/1851* (2013.01); *C23C 18/1865* (2013.01); *C23C 18/1868* (2013.01); *C23C 18/38* (2013.01)

(58) Field of Classification Search
None
See application file for complete search history.

(56) References Cited

U.S. PATENT DOCUMENTS 6,555,158 B1 * 4/2003 Yoshio ................ C23C 18/1607
257/E21.174

FOREIGN PATENT DOCUMENTS

| JP | 2001107256 A | * | 4/2001 |
| JP | 2002-302773 A | | 10/2002 |

* cited by examiner

*Primary Examiner* — Michael P Rodriguez
(74) *Attorney, Agent, or Firm* — Pearne & Gordon LLP

(57) ABSTRACT

A pre-treatment method for plating can form a plating layer having sufficient adhesivity on an inner surface of a recess and on a surface of a substrate at an outside of the recess even when the recess has a high aspect ratio. The pre-treatment method for plating includes a preparation process of preparing the substrate having the recess; a first coupling layer forming process of forming a first coupling layer 21a at least on the inner surface of the recess of the substrate by using a first coupling agent; and a second coupling layer forming process of forming a second coupling layer 21b at least on the surface of the substrate at the outside of the recess by using a second coupling agent after the first coupling layer forming process.

6 Claims, 4 Drawing Sheets

(51) Int. Cl.
*C23C 18/12* (2006.01)
*C23C 18/38* (2006.01)

PRE-TREATMENT METHOD FOR PLATING AND STORAGE MEDIUM

CROSS-REFERENCE TO RELATED APPLICATION

This application claims the benefit of Japanese Patent Application No. 2013-241090 filed on Nov. 21, 2013, the entire disclosures of which are incorporated herein by reference.

TECHNICAL FIELD

The embodiments described herein pertain generally to a method of performing a pre-treatment as a surface treatment before filling a recess formed in a substrate by plating.

BACKGROUND

Recently, semiconductor devices such as a LSI or the like have been required to have higher density in order to meet requirements for reducing the mounting space or for improving the processing rate. As an example of a technology that achieves the high density, there has been known a multilayer wiring technology of manufacturing a multilayer substrate, such as a three-dimensional LSI or the like, by stacking multiple wiring substrates.

According to the multilayer wiring technology, a TSV (Through Silicon Via), which penetrates the wiring substrates and in which a conductive material such as copper (Cu) is buried, is typically formed in the wiring substrate in order to obtain electrical connection between the wiring substrates. As an example of a technology for forming the TSV in which a conductive material is buried, there has been known an electroless plating method.

In case of forming a metal film by electroless plating, it is required to improve adhesivity between a base and the metal layer. For the purpose, conventionally, a self-assembled monolayer (SAM) is formed on the base by using a coupling agent such as a silane coupling agent or a titanium coupling agent, and a catalytic metal such as palladium particles is provided on the base with the self-assembled monolayer therebetween (see, for example, Patent Document 1).

In general, since a main component of the titanium coupling agent is $TiO_x$, a performance of adsorption of metal catalytic particles is superior. Thus, by using the titanium coupling agent, adhesivity of the metal film can be improved, as compared to the case of using the silane coupling agent. Since, however, the titanium coupling agent cannot be adsorbed onto the substrate by a vacuum deposition process, it is very difficult to attach the titanium coupling agent in a deep hole such as a TSV having a high aspect ratio, or it takes a very long time to complete the process.

Meanwhile, since the silane coupling agent can be adsorbed onto the substrate through the vacuum deposition process, the silane coupling agent having high coverage can be attached even on an inner surface of a recess such as a TSV having a high aspect ratio. Since, however, the silane coupling agent has low adhesivity, a film formed at an outside of the recess may be separated by a membrane stress generated during a copper electroplating or by CMP (Chemical Mechanical Polishing).

Patent Document 1: Japanese Patent Laid-open Publication No. 2002-302773

SUMMARY

In view of the foregoing, example embodiments provide a pre-treatment method for plating, capable of forming a plating layer having sufficient adhesivity on an inner surface of a recess such as a via and on a surface of a substrate at an outside of the recess even when the recess has a high aspect ratio.

In one example embodiment, a pre-treatment method for plating includes a preparation process of preparing a substrate having a recess; a first coupling layer forming process of forming a first coupling layer at least on an inner surface of the recess of the substrate by using a first coupling agent; and a second coupling layer forming process of forming a second coupling layer at least on a surface of the substrate at an outside of the recess by using a second coupling agent after the first coupling layer forming process.

In another example embodiment, a computer-readable storage medium has stored thereon computer-executable instructions that, in response to execution, cause a plating system to perform a pre-treatment method for plating According to the example embodiments, by using the first coupling agent having high coverage in the first coupling forming process, for example, a uniform coupling layer can be formed on the inner surface of the recess. Further, by using the second coupling agent having high adhesivity in the second coupling layer forming process, a coupling layer strongly coupled to the surface of the substrate at the outside of the recess can be formed. That is, by using different coupling agents for the different places depending on the properties required at those places, it is possible to form a uniform plating layer having sufficient adhesivity on the entire surface of the substrate. Further, the different coupling agents can be used without needing to use any special means, such as masking, for distinguishing them.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1A:
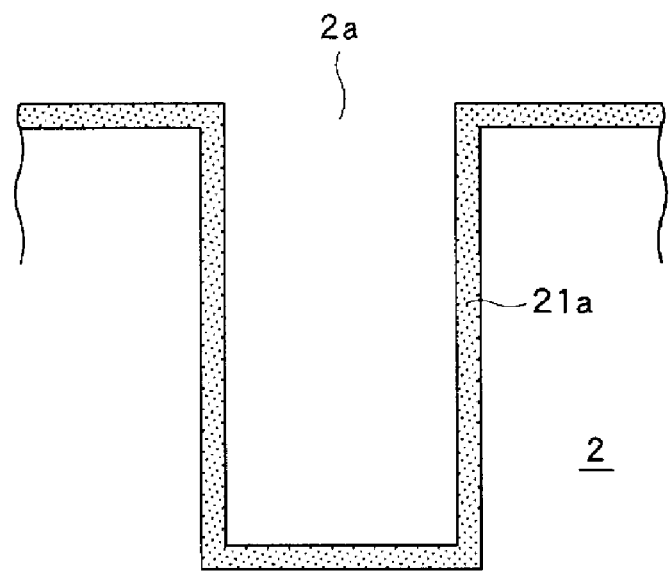
FIG. 1A and FIG. 1B are cross sectional views of a substrate in the vicinity of a recess in order to explain a silane coupling process and a titanium coupling process.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a series of processes of burying Cu (copper) in a recess (a recess to be formed as a TSV (Through Silicon Via)) formed on a substrate will be described in detail with reference to the accompanying drawings. These series of processes include respective processes of a pre-treatment method for plating in accordance with an example embodiment.

A substrate (silicon substrate) 2 having a previously formed recess (hole) 2a to be formed as a TSV is prepared. The recess 2a may be formed by a commonly known dry etching process using, for example, photolithography. As one example, the recess 2a may be formed by ICP-RIE (Inductively Coupled Plasma Reactive Ion Etching).

Below, the pre-treatment for plating will be discussed.

(Hydrophilic Process)

First, a hydrophilic process is performed on the substrate 2. The hydrophilic process may be implemented by any of various commonly known methods such as a UV (Ultraviolet) irradiation process, a plasma oxidation process, a SPM process (Piranah cleaning), and so forth. Through this hydrophilic process, a surface of the substrate is turned into a state where a coupling agent to be described later can be easily coupled to the surface of the substrate. In case that the hydrophilic process is implemented by the SPM process, a rinse process by DIW (pure water) is performed after the SPM process.

(Silane Coupling Process)

Subsequently, a silane coupling process, in which a silane-based coupling layer 21a (see FIG. 1A) is formed on the surface of the substrate including an inner surface of the recess 2a by adsorbing a silane coupling agent, is performed. Here, the term "silane-based coupling layer" implies a layer composed of a self-assembled monolayer formed from a silane coupling agent. This silane-based coupling layer is provided between a base (here, silicon) and an upper layer (a catalytic particle-containing layer 22 to be described later), and enhances the coupling therebetween.

Figure 3A:
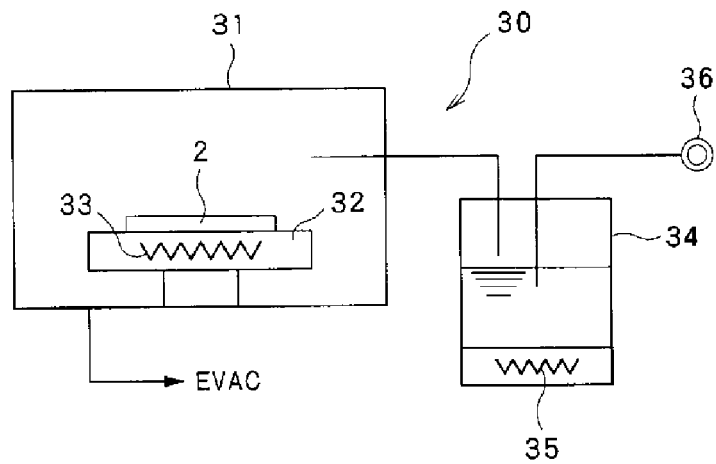
FIG. 3A to FIG. 3C are diagrams schematically illustrating configurations of apparatuses used in a pre-treatment for plating.

In the present example embodiment, the silane coupling process is implemented by a vacuum deposition process. The vacuum deposition process may be performed by using a vacuum deposition apparatus 30 having a configuration schematically illustrated in FIG. 3A, for example. In this apparatus, the substrate 2 is mounted on a mounting table 32 provided within a processing chamber 31 in a vacuum (decompressed) atmosphere, and the substrate 2 is heated to, e.g., about 100° C. by a heater 33 embedded in the mounting table 32. In this state, a silane coupling agent stored in a liquid state within a tank 34 is heated and vaporized by a heater 35 to be supplied into the processing chamber 31 by being carried with a carrier gas supplied from a carrier gas supply source 36.

Alternatively, the silane coupling process may be implemented by a liquid process. As the liquid process, a spin-on process using a spinner (a spin-type liquid processing apparatus) to be used in a titanium coupling process to be described later, an immersion process of immersing a substrate in a bath filled with a silane-coupling agent, or the like may be used. Further, in case of performing the silane coupling process through such a liquid process, a bake process needs to be additionally performed before the subsequent titanium coupling process is conducted.

If an aspect ratio of the recess 2a is high (for example, if the recess 2a is a TSV having a high aspect ratio as in the present example embodiment), it may be very difficult or impossible to allow the silane coupling agent to reach a bottom of the recess 2a through the liquid process, or it may take an unacceptably long time from the viewpoint of manufacturing technology. Thus, it may be desirable to implement the silane coupling process by the vacuum deposition process. For this reason, the silane coupling process in this example embodiment is implemented by the vacuum deposition process.

A state where the silane coupling process is completed is depicted in FIG. 1A. A film formed from the silane coupling agent, i.e., the silane-based coupling layer 21a is formed on the entire inner surface of the recess 2a and on the entire surface (top surface) of the substrate 2 at an outside of the recess 2a.

(Titanium Coupling Process)

Now, the titanium coupling process of forming a titanium-based coupling layer 21b (see FIG. 1B) by adsorbing a titanium coupling agent to the surface of the substrate including the inner surface of the recess is performed. Here, the term "titanium-based coupling layer" refers to a film composed of a self-assembled monolayer formed from a titanium coupling agent. This titanium-based coupling layer is provided between the base and the upper layer and enhances the coupling therebetween.

The titanium coupling process may be implemented by a liquid process. As the liquid process, an immersion process of immersing the substrate in a bath filled with a titanium-coupling agent or a spin-on process using a spinner (a spin-type liquid processing apparatus) 40 having a configuration schematically illustrated in FIG. 3B, or the like may be used. In the present example embodiment, the titanium coupling process is performed through the spin-on process.

Figure 3B:
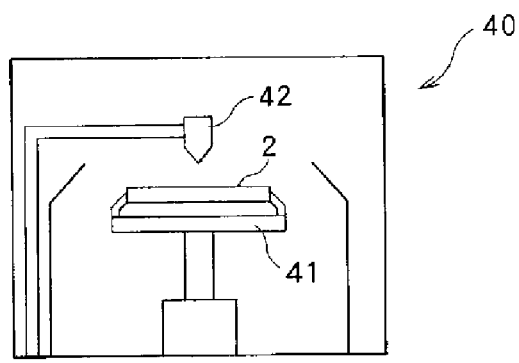

The spin-on process involves rotating the substrate 2 horizontally held on a spin chuck 41 about a vertical axis line and discharging a titanium coupling agent toward a central portion of the substrate 2 from a nozzle 42, as depicted in FIG. 3B. The titanium coupling agent in a liquid state discharged onto the central portion of the surface of the substrate 2 is diffused onto a peripheral portion of the substrate by a centrifugal force, so that a film formed from the titanium coupling agent, i.e., the titanium-based coupling layer 21b is formed on the surface of the substrate. This process may be performed in the air at a room temperature.

Figure 1B:
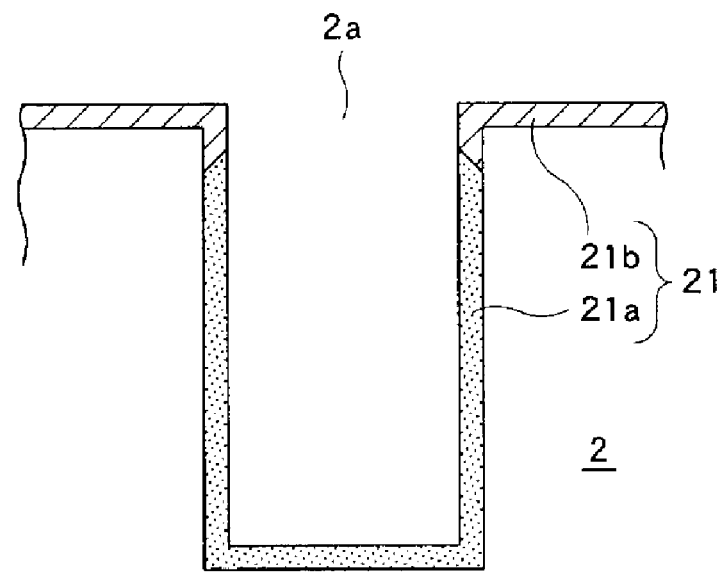

In the present example embodiment, the titanium coupling agent is not intended to reach the inside of the recess 2a for the reasons as will be described in detail later. Thus, the spin-on process is more desirable than the immersion process, since it is possible to suppress the titanium coupling agent from entering the recess 2a by controlling a rotational number in the spin-on process Upon the completion of the titanium coupling process, the silane-based coupling layer 21a and the titanium-based coupling layer 21b are found to be formed on the inner surface of the recess 2a and in the vicinity thereof, as schematically illustrated in FIG. 1B. A portion of the previously formed silane-based coupling layer 21a on which the titanium coupling process is performed is converted to the titanium-based coupling layer 21b. This will be elaborate later.

(Baking Process)

Figure 3C:
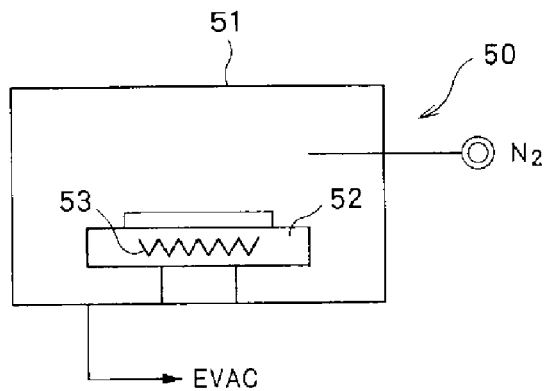

Upon the completion of the titanium coupling process, a baking process for the titanium coupling agent is performed. This baking process may be implemented by heating the substrate under a low oxygen atmosphere, e.g., under a nitrogen gas atmosphere. To elaborate, by using a heating apparatus (bake apparatus) 50 having a configuration schematically illustrated in FIG. 3C, for example, the substrate 2 is mounted on a mounting table 52 provided within a processing chamber 51 under a nitrogen gas atmosphere, and the substrate 2 is heated to, e.g., about 100° C. by a heater 53 embedded in the mounting table 52. Through this baking process, the formation of the titanium-based coupling layer 21b is completed.

Figure 2A:
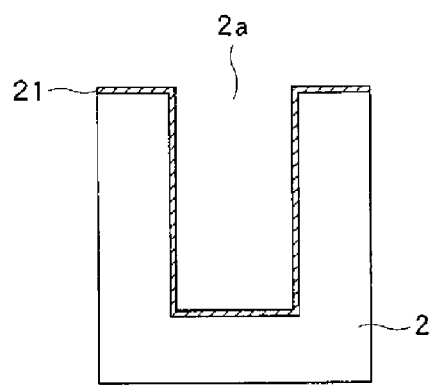
FIG. 2A to FIG. 2F are cross sectional views of the substrate in the vicinity of a recess in order to explain a TSV forming process.

The subsequent processes will be explained with reference to FIG. 2A to FIG. 2F. In FIG. 2A to FIG. 2F, for the simplicity of illustration, the silane-based coupling layer 21a and the titanium-based coupling layer 21b are represented by a single coupling layer 21 without being distinguished from each other. FIG. 2A illustrates a state where the baking process is completed.

(Catalytic Particle-Containing Film Forming Process)

Subsequently, a catalytic particle-containing film forming process is performed. In this process, a Pd nano-colloid solution prepared by dispersing Pd nanoparticles as catalytic metal particles and PVP (Polyvinylpyrrolidone) as a dispersing agent for coating the Pd nanoparticles in a solvent, i.e., a catalytic particle solution is supplied onto the substrate.

Figure 2B:
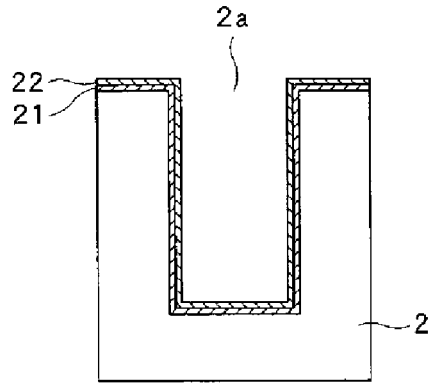

The catalytic particle-containing film forming process may be performed by using the spinner 40 having the configuration schematically illustrated in FIG. 3B, for example. The substrate 2 horizontally held on the spin chuck 41 is rotated about a vertical axis line, and a catalytic particle solution is discharged toward the central portion of the rotating substrate 2 from a nozzle. As a result, as depicted in FIG. 2B, a catalytic particle-containing film 22 containing catalytic metal particles is formed on the coupling layer 21 at the inner surface of the recess 2a and at the surface of the substrate 2 at the outside of the recess 2a.

(Heating Process)

Upon the completion of the catalytic particle-containing film forming process, a heating process is performed. The heating process may be implemented by heating the substrate 2 in a vacuum (decompressed) atmosphere. For example, the heating process is performed in the heating apparatus 50 having the configuration schematically illustrated in FIG. 3C. To elaborate, the substrate 2 is mounted on the mounting table 52 within the processing chamber 51 under a vacuum (decompressed) atmosphere (only evacuation is performed without supplying a nitrogen gas) and is heated to a temperature of 100° C. to 280° C. By performing the heating process, the catalytic particle-containing film 22 is found to be strongly coupled to the coupling layer 21.

Through the above-described processes, the pre-treatment for plating is completed.

(Barrier Layer Forming Process)

Figure 2C:
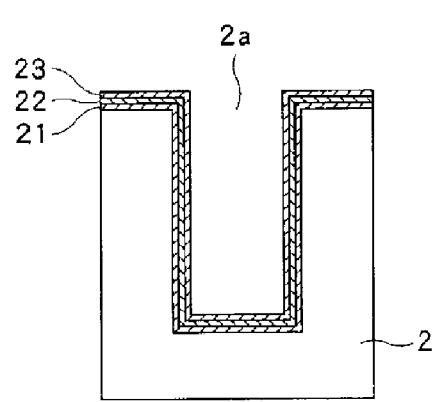

Upon the completion of the second heating process, a Co—W-based barrier layer 23 (containing cobalt and tungsten) is formed by a commonly known electroless plating technology, as depicted in FIG. 2C. At this time, catalytic particles serve as a catalyst for electroless plating.

(Seed Layer Forming Process)

Figure 2D:
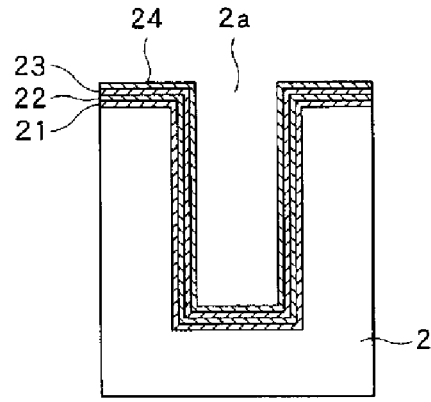

If the barrier layer forming process is completed, a Cu seed layer 24 is formed on the barrier layer 23 by a commonly known electroless plating technology, as depicted in FIG. 2D.

(Burying Process)

Figure 2E:
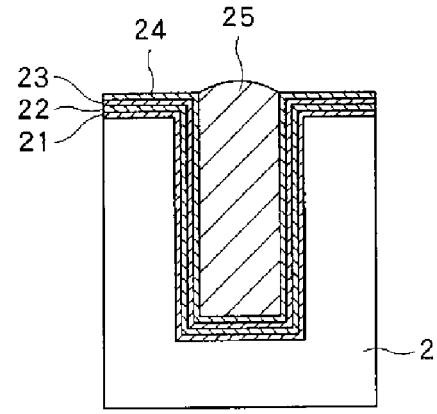
Figure 2F:
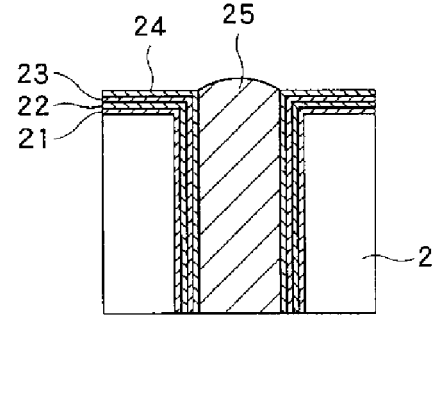

Upon the completion of the seed layer forming process, a Cu plating layer 25 is formed on the Cu seed layer 24 by a commonly known electroless plating technology, as depicted in FIG. 2E. At this time, the recess 2a is completely filled with the Cu plating layer 25.

If the burying process is finished, a rear surface of the substrate 2 is polished by the CMP, so that the Cu plating layer 25 is exposed on the rear surface of the substrate 2. Through the above-described processes, a series of TSV filling processes are completed.

Below, advantages of a two coupling processes in accordance with the example embodiment will be described.

As briefly mentioned in the section of BACKGROUND, since a main component of the titanium-based coupling layer is $TiO_x$, a performance of adsorption of catalytic metal particles such as Pd nanoparticles is superior. Thus, in consideration of the ability for coupling the base (in the present example embodiment, silicon) and an upper layer (in the present example embodiment, a catalytic metal particle-containing film to be described later), the titanium coupling layer is superior to a silane coupling layer.

Meanwhile, since the titanium coupling agent may not be effectively adsorbed onto the substrate by the vacuum deposition process, a liquid process needs to be performed. However, the following problems may be generated in the liquid process of the titanium coupling agent.

(1) In the liquid process, it is impossible to allow the titanium coupling agent to reach the inside of the recess 2a having a high aspect ratio. Even if possible, it may take an unacceptably long time from the viewpoint of manufacturing the technology.

(2) After the titanium coupling process is performed through the liquid process, a baking process needs to be performed as a post-treatment. If these processes are not performed sufficiently, the quality of the titanium coupling layer may be deteriorated, and a strong catalytic particle containing-film 22 may not be attached on the titanium-based coupling layer 21b.

(3) Even if the titanium coupling agent is diluted in an organic solvent such as IPA (Isopropyl alcohol), hydrolysis reaction may easily occur, and the titanium coupling agent may be degraded in a relatively short time period. In view of this, the liquid process needs to be performed for a relatively short time period.

In consideration of the above-mentioned problems, the present inventors have reached a conclusion that it is desirable to perform a silane coupling process, not a titanium coupling process, to the inside of the recess because the silane coupling process can be performed by the vacuum deposition process which is a film forming process having high coverage.

Thus, in accordance with the present example embodiment, a silane coupling process is first performed through a deposition process. Then, a silane coupling agent is allowed to reach the bottom of the recess 2a. As a result of this process, a silane-based coupling layer 21a is formed on the inner surface of the recess 2a and on the entire surface of the substrate at the outside of the recess 2a, as depicted in FIG. 1A. Then, a titanium coupling process is performed through a liquid process.

If the titanium coupling process is performed on the silane-based coupling layer, the titanium coupling agent acts to remove the property of the silane-based coupling layer, so that a state as if the titanium coupling layer is formed from the first is obtained. This property is very advantageous when using the different coupling agents for different places without using any special means, such as masking, for distinguishing them.

Here, the titanium coupling process is implemented by the liquid process, particularly, by the spin-on process. Therefore, as long as a processing time is not set to be long, the titanium coupling agent may hardly reach the inside of the recess 2a having the high aspect ratio. As an example, the titanium coupling agent only reaches a depth ranging from just 10 μm to 30 μm from an opening edge of the recess 2a.

Accordingly, as depicted in FIG. 1B, the silane-based coupling layer 21a remains on the inner surface of the recess 2a in the range from a central portion in a depth direction to a bottom portion thereof, whereas the titanium-based coupling layer 21b is formed on the inner surface of the recess 2a in the vicinity of the opening edge thereof and, also, on the surface of the substrate 2 at the outside of the recess 2a.

Adhesivity of the plating is especially an important issue on a region in the vicinity of the opening edge of the recess 2a. A high internal stress is applied to a plating film on this region, and a stress may be easily concentrated on this region when the CMP (Chemical Mechanical Polishing) is performed as a post-treatment. Therefore, especially high adhesivity is required for this region. Meanwhile, the adhesivity as high as required on the region in the vicinity of the opening edge of the recess 2a is not required within the recess 2a. Within the recess 2a, it is important to form a uniform plating layer without a defect.

Accordingly, as illustrated in FIG. 1B, by forming the titanium-based coupling layer 21b having a strong coupling force on the region that need to stand the high stress while forming the silane-based coupling layer 21a, which can form a film with high coverage, on the other region, it is possible to satisfy the aforementioned contradictory requirements.

Further, since the titanium coupling agent does not reach the inside of the recess 2a, a baking process as a post-treatment can be performed easily.

As aforementioned, the titanium coupling agent does not need to reach the inside of the recess 2a, and it means that the liquid process can be completed in a very short time period. This short processing time is desirable in handling the titanium coupling agent which tends to be easily degraded with the lapse of time, as mentioned above. Further, if the titanium coupling process can be performed for a short time period, a consumption amount of the titanium coupling agent can be reduced when performing the spin-on process. By way of example, in the event that the substrate 2 is a 12-inch wafer, a consumption amount of the titanium coupling agent only needs to be 10 ml for a single substrate.

According to the above-described example embodiment, by using the advantages of the two kinds of coupling agents in combination, it is possible to form a high-quality plating layer. Further, any special means, such as masking, for distinguishing the two different coupling agents is not required.

In the above-described example embodiments, the silane-coupling agent and the titanium coupling agent are used as the two kinds of coupling agents. However, the example embodiment is not limited thereto, and various other kinds of coupling agents can be used in combination.

In the above-described example embodiment, the catalytic metal particles contained in the catalytic particle solution are palladium (Pd). However, the example embodiment is not limited thereto, and gold (Au), platinum (Pt), ruthenium (Ru), or the like may also be used, for example.

In the present example embodiment, the dispersing agent contained in the catalytic particle solution is polyvinylpyrrolidone (PVP). However, the example embodiment is not limited thereto, and polyacrylic acid (PAA), polyethyleneimine (PEI), tetramethylammonium (TMA), citric acid, or the like may also be used, for example.

In the above-described example embodiment, the heating process is performed in the low oxygen atmosphere having a low oxygen concentration or in the vacuum atmosphere. However, the heating process may be performed in the atmospheric (air) atmosphere. In such a case, the adhesivity tends to be lower than that in case of performing the heating process in the low oxygen atmosphere having the low oxygen concentration or in the vacuum atmosphere. However, if the reduced level of the adhesivity is acceptable, it is desirable that the heating process is performed in the atmospheric (air) atmosphere to reduce the processing cost.

In the above-described example embodiment, the barrier layer 23 is made of the Co—W-based material. However, the example embodiment may not be limited thereto, and the barrier layer may be formed of a commonly known appropriate barrier material such as, but not limited to, Ni—W-based material (containing nickel and tungsten). Further, the barrier layer may be formed in two layers, as disclosed in Japanese Patent Laid-open Publication No. 2013-194306 filed by the present applicant prior to the filing of the present application.

In the above-described example embodiment, the seed layer 24 and the plating layer 25 are cooper (Cu). However, the seed layer 24 and the plating layer 25 may be, by way of example, but not limitation, tungsten (W), cobalt (Co), nickel (Ni) or an alloy thereof. The barrier layer 23 may be appropriately changed depending on the material of the seed layer 24 and the plating layer 25.

Further, in the above-described example embodiment, the recess 2a serves as a TSV. However, the example embodiment may not be limited thereto, and the recess may serve as a typical via or trench.

Figure 4:
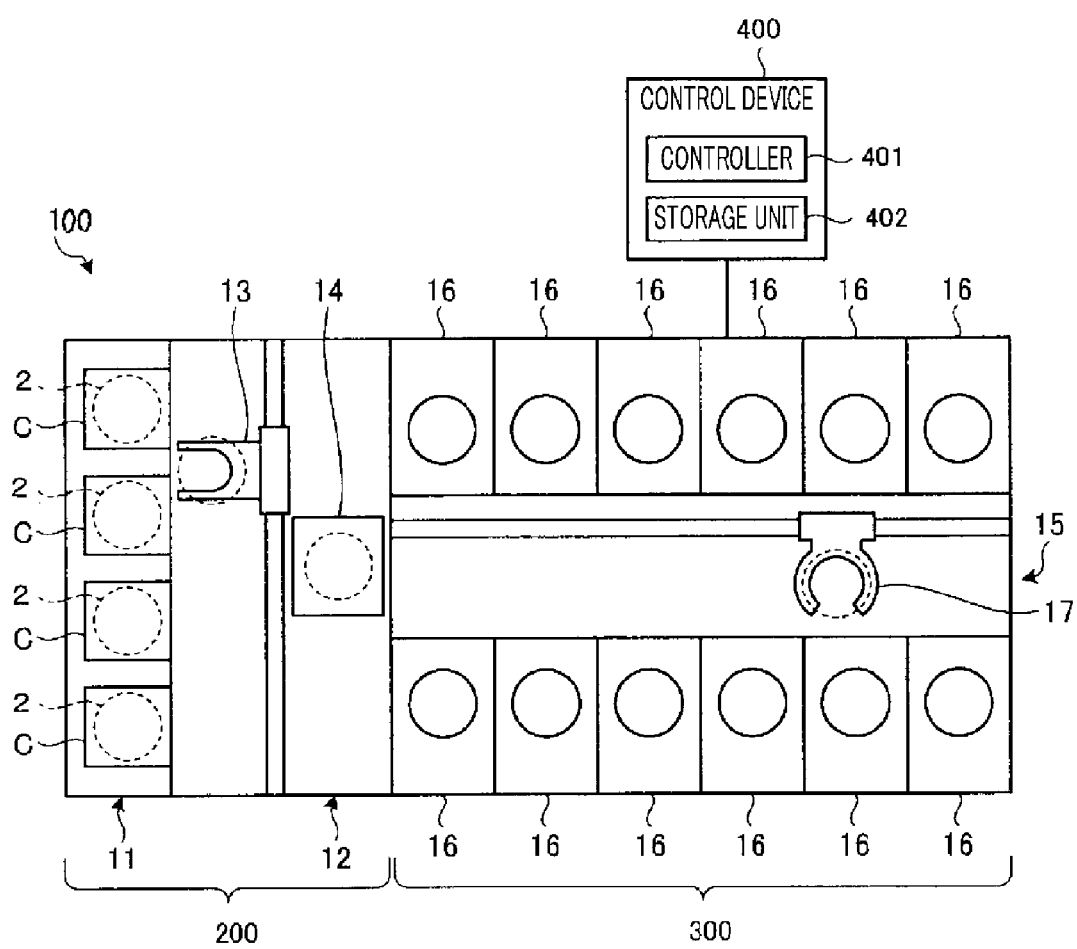
FIG. 4 is a schematic plane view illustrating an example configuration of a plating system of performing a series of processes including the pre-treatment for plating.

The above-described series of processes, i.e., the hydrophilic process, the silane coupling process, the titanium coupling process, the baking process, the catalytic particle-containing film forming process, the heating process, the barrier layer forming process, the seed layer forming process and the burying process can be performed by, for example, a plating system schematically illustrated in FIG. 4.

In a plating system 100 shown in FIG. 4, a substrate transfer device 13 provided in a loading/unloading station 200 is configured to take out a substrate 2 from a carrier C mounted on a carrier mounting unit 11 to mount the substrate 2 on a transit unit 14. Processing units 16 provided in a processing station 300 are configured to perform at least one of the above-described series of processes. That is, some of the processing units 16 are configured as the apparatuses 30, 40 and 40 illustrated in FIG. 3A to FIG. 3C, respectively. The substrate 2 mounted on the transit unit 14 is taken out of the transit unit 14 by a substrate transfer device 17 of the processing station 300, and then, is loaded into the processing units 16 corresponding to the above-described processes in sequence. In each processing unit 16, a preset process is performed. After the series of processes are completed, the processed substrate 2 is unloaded from the processing unit 16 to be mounted on the transit unit 14. Then, the processed substrate 2 mounted on the transit table 14 is returned back into the carrier C in the carrier mounting unit 11 by the substrate transfer device 13.

The plating system 100 further includes a control device 400. The control device 400 is, for example, a computer and includes a controller 401 and a storage unit 402. The storage unit 402 stores therein programs for controlling various processes performed in the plating system 100. The controller 401 controls the operation of the plating system 100 by reading out a program from the storage unit 401 and executing the program. That is, the control device 400 controls the operations of the individual processing units 16 and the transfer operations for the substrate 2 by the substrate transfer devices 13 and 17 in order to perform the above-described series of processes related to the plating.

The programs may be stored in a computer-readable storage medium and installed on the storage unit 402 of the control device 400 from that storage medium. Here, the computer-readable storage medium may be, by way of example, but not limitation, a hard disk (HD), a flexible disk (FD), compact disk (CD), a magnet optical disk (MO) or a memory card.

We claim:

1. A pre-treatment method for plating, the pre-treatment method comprising:
   a preparing process of preparing a substrate having a recess;
   a first coupling layer forming process of forming a first coupling layer at least on an inner surface of the recess of the substrate by using a first coupling agent; and
   a second coupling layer forming process of forming a second coupling layer at least on a surface of the substrate at an outside of the recess by using a second coupling agent which is different from the first coupling agent after the first coupling layer forming process.

2. The pre-treatment method of claim 1,
   wherein the first coupling agent is a silane coupling agent and the second coupling agent is a titanium coupling agent.

3. The pre-treatment method of claim 1,
   wherein the first coupling layer forming process is performed through a vacuum deposition process and the second coupling layer forming process is performed through a liquid process.

4. The pre-treatment method of claim 3,
   wherein the liquid process is performed by supplying the second coupling agent in a liquid state onto the substrate while rotating the substrate about a vertical axis line in a horizontal posture.

5. The pre-treatment method of claim 1, further comprising:
   an attaching process of attaching catalytic metal particles on the first coupling layer and the second coupling layer after the second coupling layer forming process.

6. A non-transitory computer-readable medium having stored thereon computer executable instructions that, in response to execution, cause a plating system to perform the pre-treatment method of claim 1.

* * * * *